(12) United States Patent
Uchida

(10) Patent No.: US 7,765,866 B2
(45) Date of Patent: Aug. 3, 2010

(54) PRESSURE SENSOR HAVING INSECT ENTERING RESTRICTION ELEMENT

(75) Inventor: Kouji Uchida, Kariya (JP)

(73) Assignee: DENSO CORPORATION, Kariya (JP)

( * ) Notice: Subject to any disclaimer, the term of this patent is extended or adjusted under 35 U.S.C. 154(b) by 91 days.

(21) Appl. No.: 12/219,780

(22) Filed: Jul. 29, 2008

(65) Prior Publication Data

US 2009/0100936 A1    Apr. 23, 2009

(30) Foreign Application Priority Data

Oct. 18, 2007    (JP) .............................. 2007-271351

(51) Int. Cl.
*G01F 3/20*    (2006.01)
(52) U.S. Cl. .............................. 73/270; 73/714; 73/715; 73/753; 73/756
(58) Field of Classification Search ........................ None
See application file for complete search history.

(56) References Cited

U.S. PATENT DOCUMENTS

| | | | |
|---|---|---|---|
| 4,502,335 A * | 3/1985 | Wamstad et al. | 73/721 |
| 4,888,992 A * | 12/1989 | Mathias et al. | 73/727 |
| 4,984,466 A * | 1/1991 | Yasui et al. | 73/721 |
| 5,438,876 A * | 8/1995 | Lewis | 73/726 |
| 5,522,267 A * | 6/1996 | Lewis | 73/726 |
| 5,747,694 A | 5/1998 | Baba et al. | |
| 5,900,554 A | 5/1999 | Baba et al. | |
| 6,948,374 B2 * | 9/2005 | Miyashita | 73/718 |
| 7,216,546 B2 | 5/2007 | Hayashi et al. | |
| 7,600,432 B2 * | 10/2009 | Nomura et al. | 73/706 |

FOREIGN PATENT DOCUMENTS

| | | |
|---|---|---|
| JP | A-11-101659 | 4/1999 |
| JP | A-11-148850 | 6/1999 |
| JP | A-2000-222645 | 8/2000 |
| JP | A-2006-105853 | 4/2006 |
| JP | A-2006-329754 | 12/2006 |

* cited by examiner

*Primary Examiner*—Lisa M Caputo
*Assistant Examiner*—Jermaine Jenkins
(74) *Attorney, Agent, or Firm*—Posz Law Group, PLC

(57) ABSTRACT

A pressure sensor is provided. The pressure sensor includes a sensing element, a case, a line element, an insect entering restriction element. The case has a space for receiving the sensing element. The case includes a pressure introduction passage, which is in communication with the space to introduce a pressure medium into the sensing element. The line element has a first portion electrically connected with the sensing element and a second portion to be electrically connected to an external element. The insect entering restriction element extends across a path on the exterior surface of the case, the path interconnecting between the second portion of the line element and the open end of pressure introduction passage.

13 Claims, 3 Drawing Sheets

PRESSURE SENSOR HAVING INSECT ENTERING RESTRICTION ELEMENT

CROSS REFERENCE TO RELATED APPLICATION

The present application is based on Japanese Patent Application No. 2007-271351 filed on Oct. 18, 2007, the disclosure of which is incorporated herein by reference.

BACKGROUND OF THE INVENTION

1. Field of the Invention

The present invention relates to a pressure sensor.

2. Description of Related Art

Patent Document 1 recites a configuration of a pressure sensor. According to the configuration, the pressure sensor includes an IC chip, a wire bonding element, an adhesive member, and a case having an air introduction passage. The air introduction passage has a pectinated or helical shape. The adhesive element is disposed in the air introduction passage. The adhesive element protects the IC chip and the wire bonding element from a small insect in such a manner that, when a small insect enters the pressure sensor, the insect may be stuck in the adhesive element.

Patent Document 2 recites another configuration of a pressure sensor. According to the configuration, a filter is disposed at an open end of an air passage to effectively inhabit a foreign substance from entering the air passage.

Patent Document 3 recites another configuration. According to the configuration, a radius of an air passage is enlarged at an open end of an air passage to prevent an insect from building a nest at an inner wall of the open end of the air passage.

Patent Document 1: JP-A-2006-105853

Patent Document 2: JP-A-H9-43085, corresponding to U.S. Pat. No. 5,900,554

Patent Document 3: JP-A-H11-101659

According to Patent Document 1, however, since the air introduction passage has a pectinated shape or a helical shape, and since the adhesive element is disposed in the air introduction passage, the pressure sensor eventually has a complex configuration. In addition, when an insect worms on the side wall to enter the sensor, the insect may be eventually stuck in the air introduction passage. Stuck insects may get jammed in the air introduction passage and may become a bottleneck for air introduction. It becomes therefore difficult for the pressure sensor to detect air pressure with high accuracy.

According to Patent Document 2, since the pressure sensor requires a filter as an additional part, the number of parts and manufacturing cost increase. Also, when a filer is clogged, the clogged filter becomes a bottleneck for air introduction in a similar manner to that in the above case, and it becomes difficult for the pressure sensor to detect air pressure with high accuracy.

According to the Patent Document 3, the enlarged radius of the open end of the air passage can prevent an insect from building a nest but not prevent an insect from entering.

SUMMARY OF THE INVENTION

In view of the above-described difficulty, it is an object of the present invention to provide a pressure sensor.

According to an aspect of the present invention, a pressure sensor is provided. The pressure sensor includes a sensing element, a case, a line element, and an insect entering restriction element. The sensing element includes a sensor chip. The sensor chip has a diaphragm. The case has a space for receiving the sensing element. The case further has a pressure introduction passage, which is in communication with the space to introduce a pressure medium into the sensing element. The pressure introduction passage has an open end on an exterior surface of the case. The line element has a first portion exposed to the space and a second portion exposed to an outside of the case. The first portion is electrically connected with the sensing element. The second portion is capable of being providing an electrical connection between the sensing element and an external element. The sensing element outputs a detection signal to the line element. The detection signal depending on a pressure of the pressure medium applied to the diaphragm. The insect entering restriction element extends across a path on the exterior surface of the case, the path interconnecting between the second portion of the line element and the open end of the pressure introduction passage.

According to the above pressure sensor, the insect entering restriction element extends across the path on the exterior surface of the case, the path interconnecting between the pressure introduction passage and the external element such as a circuit substrate to which the pressure is to be mounted. Therefore, when an insect worms on the path to enter the pressure introduction passage, the insect entering restriction element effectively inhibit the insect from entering the pressure introduction passage. Thus, the pressure introduction passage is not to be closed by the insect. Therefore, it is possible to restrict a decrease in pressure detection accuracy.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A pressure sensor 1 according to a first embodiment is described below with reference to the accompanying drawings. The pressure sensor 1 can be used as, for example, an exhaust pressure sensor for use in a vehicle.

Figure 1:
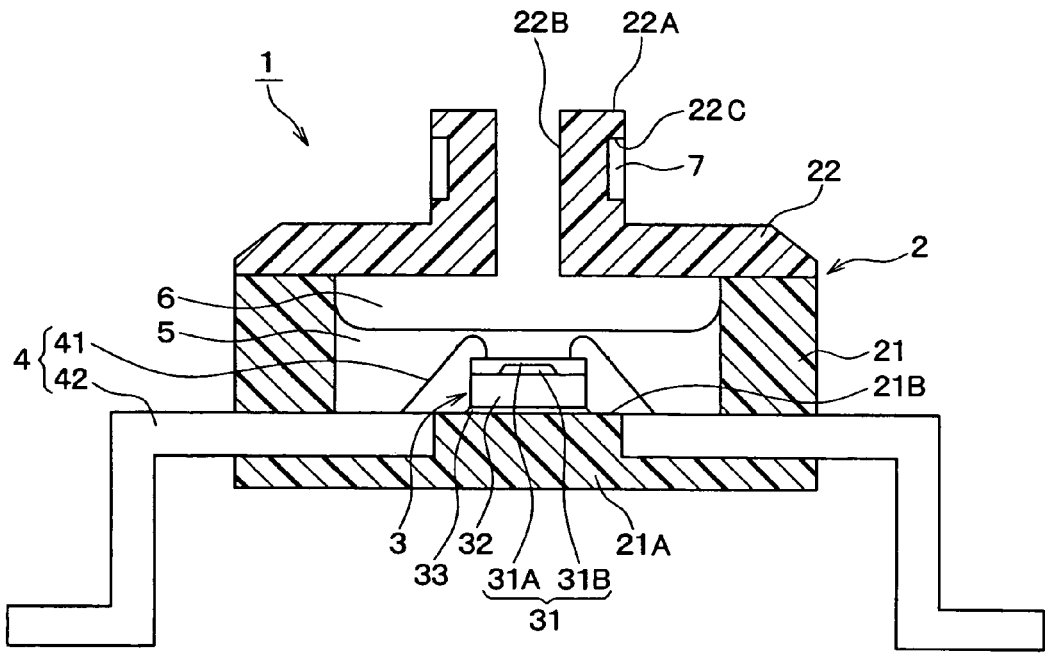
FIG. 1 is a cross sectional view illustrating a schematic configuration of a pressure sensor in accordance with a first embodiment.

FIG. 1 is a cross sectional view illustrating a schematic configuration of a pressure sensor 1 in accordance with the present embodiment.

As shown in FIG. 1, the pressure sensor 1 includes a case 2, a sensing element 3, a line element 4, and a protection element 5. The case 2 provides the pressure sensor 1 with an outline. The case 2 has a space 6 (i.e., an internal space) therein. The sensing element 3 and the protection element 5 are received in the space 6 of the case 2. The case 2 is made of resin such as polyphenylene sulfide (PPS) and the like. The case 2 includes a first case portion 21 (i.e., a lower case portion 21) and a second case portion 22 (i.e., an upper case portion 22).

The lower case portion 21 has a hollow space having an open end and a closed end. In other words, the lower case portion 21 is a tube having an open end and a closed end. The lower case portion 21 may have, for example, a cylindrical shape, a rectangular tube shape, or the like. A bottom part 21A of the lower case portion 21 defines the closed end of the hollow space. The sensing element 3 is mounted on a surface of the bottom part 21A of the lower case portion 21 so that the sensing element 3 is disposed inside the hollow space.

A shape of the upper case portion 22 is similar to that of a perimeter of the open end of the hollow space of the lower case portion 21. The upper case portion 22 is connected with a surface of the lower case portion 21 at a surface around the open end by, for example, adhesive bonding or the like. Because of the above connection, the lower case portion 21 and the upper case portion 22 form the space 6. The upper case portion 22 includes a projection part 22A at a center of the upper case portion 22. The projection part 22A projects in a direction away from the lower case portion 21. The location of the projection part 22A corresponds to that of a part of the lower case portion 21, the part to which the sensing element 3 is mounted. The projection part 22A has a cylindrical shape. The projection part 22A has a pressure introduction passage 22B having an open end, which is located at the center of the projection part 22A. More specifically, the projection part 22A and the pressure introduction passage 22B extend in a direction perpendicular to a surface of the upper case portion 22, the surface being opposite to the surface having connection with the lower case portion 21. A location of the pressure introduction passage 22B corresponds to the part of the bottom part 21A of the lower case portion 21, the part on which the sensing element 3 is mounted. Due to the above configuration, a pressure of a pressure medium is uniformly applied to the sensing element 3.

The sensing element 3 includes a sensor chip 31 and a base 32. The base 32 is bonded to a surface 21B of the bottom part 21A of the lower case portion 21 by using an adhesive agent 33.

The sensor chip 31 includes a semiconductor substrates made of, for example, n-type silicon. The sensor chip 31 includes a diaphragm 31A and an electrical circuit. The diaphragm 31A is provided by the semiconductor substrate, a rear surface of which is etched so as to have a concave shape. The electrical circuit includes a pressure sensitive element (e.g., a piezoresistance element; not shown), which is formed on the diaphragm 31A. A part of the rear surface of the sensor chip 31 is bounded to the base 32. Due to the above configuration, pressure of the pressure medium is transmitted to a front surface of the diaphragm 31A. The rear surface of the semiconductor substrate and the base 32 defines a space called a standard pressure chamber 31B. The sensing element 3 measures a relative pressure between a pressure in the standard pressure chamber 31B and the pressure of the pressure medium applied to the front surface of the diaphragm 31A. The sensor chip 31 outputs a sensor output (i.e., output signal) through the line element 4. The sensor output depends on the sensed pressure.

The base 32 is made of, for example, low-melting glass. The base 32 and the sensor chip are connected to each other by anodic bonding to seal the standard pressure chamber 31B.

The line element 4 includes a bonding wire 41 and a lead frame 42. The bonding wire 41 is electrically connected with the piezoresistance element or the electrical circuit of the sensor chip 31. The bonding wire 41 is also electrically connected with the lead frame 42. The boding wire 41 is used for, for example, supplying a power source to the sensor chip 31, connecting to ground, transmitting a signal, and the like. One end of the lead frame 42 is partially exposed to the space 6 from the surface 21B of the bottom part 21A of the lower case portion 21. The one end of the lead frame is joined with the bonding wire 41. A portion of the lead frame 42 sticks out from the lower case portion 21 and is winding in shape. The pressure sensor 1 is to be mounted to a circuit substrate (not shown) at one end of the stick-out portion of the lead frame 42.

The protection element 5 covers and protects the sensing element 3 and the bonding wire 41. The protection element 5 transmits pressure to the sensor chip 31 when the pressure medium is introduced through the pressure introduction passage 22B. That is, the protection element 5 functions as a pressure transmission element. The protection element 5 is made of, for example, gel (e.g., silicone gel).

An entering restriction element 7 is disposed on an exterior wall (i.e., exterior surface) of the pressure sensor 1 (i.e., the case 2) to effectively inhibit an insect such as ant from entering the space 6. More specifically, the projection part 22A has such a groove 22C, which surrounds an entire perimeter of the open end of the pressure introduction passage 22B. The groove 22C is filled with the entering restriction element 7 (i.e., insect entering restriction element 7).

The entering restriction element 7 includes, for example, a adhesive member, an insect killer, a bait poison, and/or the like. The adhesive member has an adhesive power. The adhesive member can catch an insect that worms on the exterior surface of the pressure sensor 1 to enter the pressure introduction passage 22B. The adhesive member is made of, for example, gel. When the adhesive member is similar to the protection element 5 in an employed gel, it is possible to simplify material preparation, that is, it is possible to restrict an increase in materials. The insect killer has an insecticidal effect. The insect killer can keep away an insect that worms on the exterior surface of the pressure sensor 1 to enter the pressure introduction passage 22B. Selection of a type of the insect killer depends on an insect supposed to enter the pressure sensor 1. When the supposed insects are ants, pyrethroid, organophosphorus agent, carbamate, aerosol or the like can be used as the insect killer. The bait poison has an insecticidal effect. The bait poison can keep away an insect, which worms on the exterior surface of the pressure sensor 1 to enter the pressure introduction passage 22B. Selection of a type of the bait poison depends on an insect supposed to enter the pressure sensor. When the supposed insect is an ant, dinotefuran can be used as the bait poison.

In the pressure sensor 1, the entering restriction element 7 is disposed on the case 2 so as to extends across a path, which leads from the circuit substrate (not shown) to the pressure introduction passage 22B via the lead frame 42 and the lower case portion 21. Therefore, when an insect worms on the path, the entering restriction element 7 catches or kills the insect. It is possible to restrict invasion of an insect.

Because of the above configuration, the pressure introduction passage 22B is not blocked by insects. The insects do not become a bottleneck for pressure introduction. It is possible to restrict a decrease in pressure detection accuracy. According to the present embodiment, the entering restriction element 7 is not disposed on the inner wall of the pressure introduction passage 22B but the exterior surface of the upper case portion 22 (i.e., an outside of the pressure introduction passage). More specifically, the entering restriction element 7 is disposed on an exterior surface of the projection part 22A. Therefore, it is not necessary for the pressure introduction passage 22B to have a complex shape.

There would exist a possibility that an insect comes flying to enter the pressure introduction passage 22B without transmitting the entering restriction element 7. However, such a possibility is remarkably low since the pressure sensor 1 is to be disposed in a place where other members surround the pressure sensor 1 or in a place where other various members are disposed adjacent to the pressure sensor 1. That is, the pressure sensor 1 is to be disposed in, for example, a door of a vehicle or an engine room of a vehicle. Therefore, in most cases, an insect is expected to worm on the path interconnecting between the exterior surface and the pressure introduction passage 22B, and thus, the insect contacts the entering restriction element 7 before the insect reaches the pressure introduction passage 22B. Therefore, it is possible to reliably provide the pressure sensor 1 with the above-described advantages.

Since the entering restriction element 7 restrict entry of an insect, and since the entering restriction element 7 does not cause the pressure introduction passage 22B to be closed, the pressure introduction passage 22B is not to be closed by clogging in a manner similar to, for example, the case in using a filter. Since a filter is to be provided separately from the element for forming the pressure introduction passage 22B (corresponding to the upper case portion 22 in the present embodiment), the filter increases the number of parts. According to the present embodiment, in contrast, since the entering restriction element 7 is integrated with the upper case portion 22, it is possible to restrict an increase in the number of parts and the manufacturing cost. Further Furthermore, since an insect can not enter the pressure introduction passage 22B, the insect does not built a nest in the pressure introduction passage 22B.

In the present embodiment, the entering restriction element 7 is disposed in a periphery of the pressure introduction passage 22B so as to surround the entire perimeter of the open end of the pressure introduction passage 22B. Even when the entering restriction element 7 surround a part of the entire perimeter of the open end of the pressure introduction passage 22B, it is possible to restrict the entering of an insect into the pressure introduction passage 22B. When the entering restriction element 7 surround the entire perimeter of the open end of the pressure introduction passage 22B, it is possible to restrict entry of an insect into the pressure introduction passage 22B more effectively.

The entering restriction element 7 is placed in the groove 22C by coating or dipping. The above placement of the entering restriction element 7 is made before or after the upper case portion 22 is connected to the lower case portion 21.

Second Embodiment

A pressure sensor 1 according to a second embodiment is described below with reference to FIG. 2. The pressure sensor 1 according to the second embodiment is different from that according to the first embodiment in location where an entering restriction element 7 is disposed.

Figure 2:
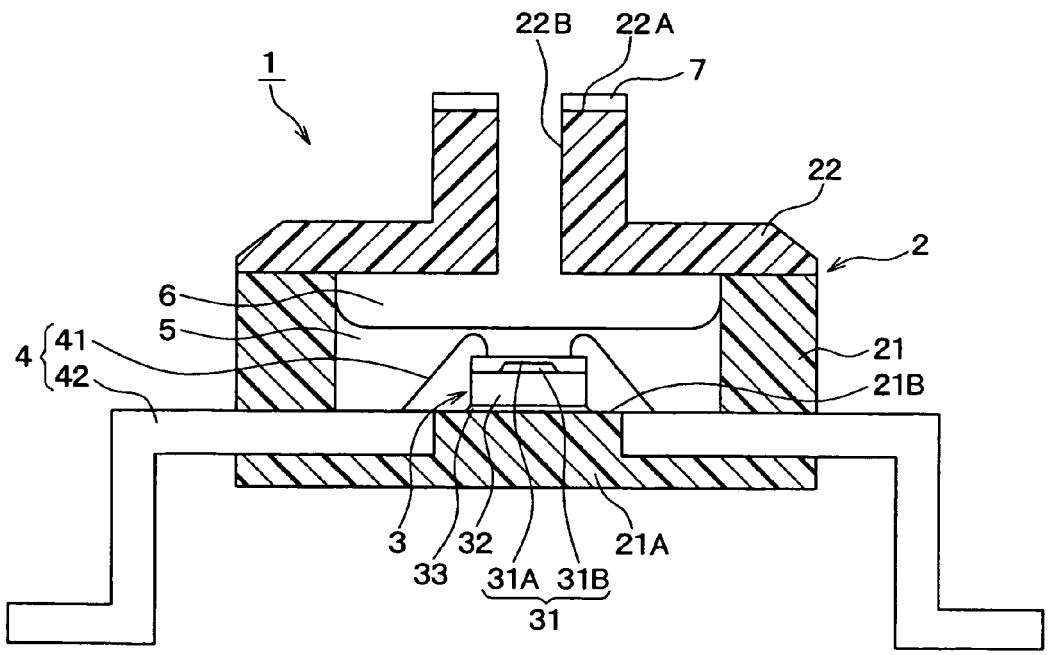
FIG. 2 is a cross sectional view illustrating a schematic configuration of a pressure sensor in accordance with a second embodiment.

FIG. 2 is a cross sectional view illustrating a schematic configuration of the pressure sensor 1 in accordance with the present embodiment. As shown in FIG. 2, the entering restriction element 7 is disposed on whole apical surface of the projection part 22A. The above configuration is provided by coating or dipping the entering restriction element 7 on the whole apical surface of the projection part 22A. The pressure sensor 1 with the above configuration has advantages almost identical to that according to the first embodiment.

Third Embodiment

A pressure sensor 1 according to a third embodiment is described below with reference to FIG. 3. The pressure sensor 1 according to the third embodiment is different from that according to the second embodiment in location where an entering restriction element 7 is disposed.

Figure 3:
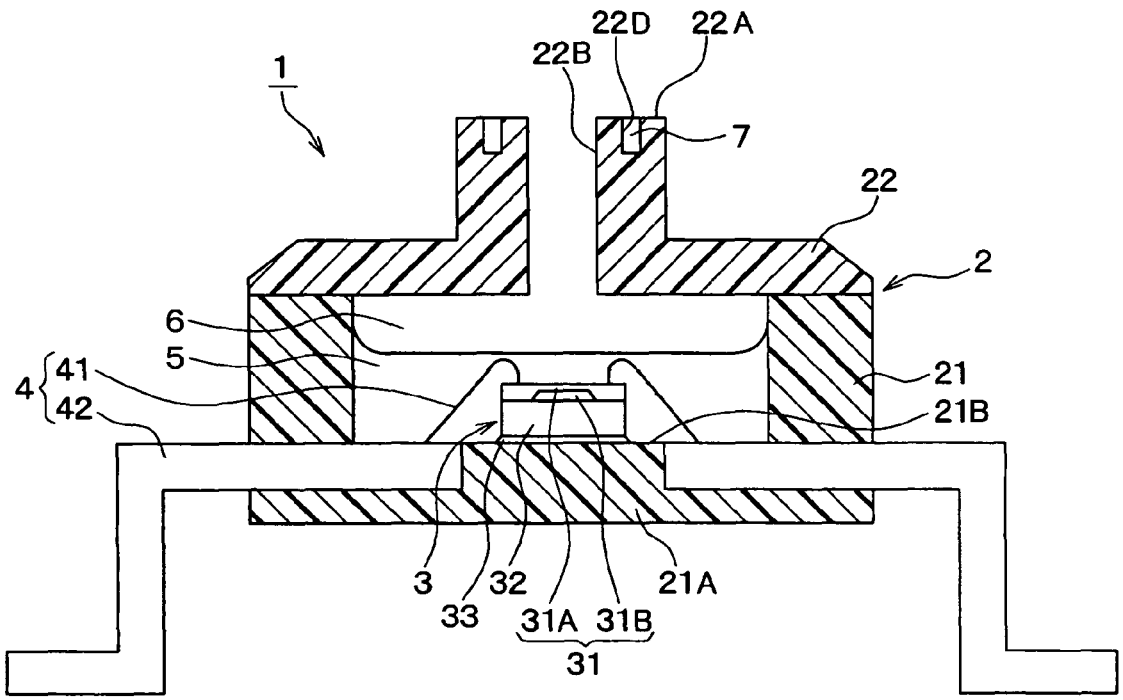
FIG. 3 is a cross sectional view illustrating a schematic configuration of a pressure sensor in accordance with a third embodiment.

FIG. 3 is a cross sectional view illustrating a schematic configuration of the pressure sensor 1 in accordance with the present embodiment. As shown in FIG. 3, a groove 22D is disposed on the apical surface of the projection part 22A so as to surround the entire perimeter of the open end of the pressure introduction passage 22B. The entering restriction element 7 is disposed in the groove 22D. To provide the above configuration, the entering restriction element 7 is coated or dipped in the groove 22D. The pressure sensor 1 with the above configuration has advantages almost identical to that according to the first embodiment.

Fourth Embodiment

A pressure sensor 1 according to a fourth embodiment is described below with reference to FIG. 4. In the pressure sensor 1 according to the present embodiment, an entering restriction element 7 is disposed in a combination manner between the first embodiment and the third embodiment.

Figure 4:
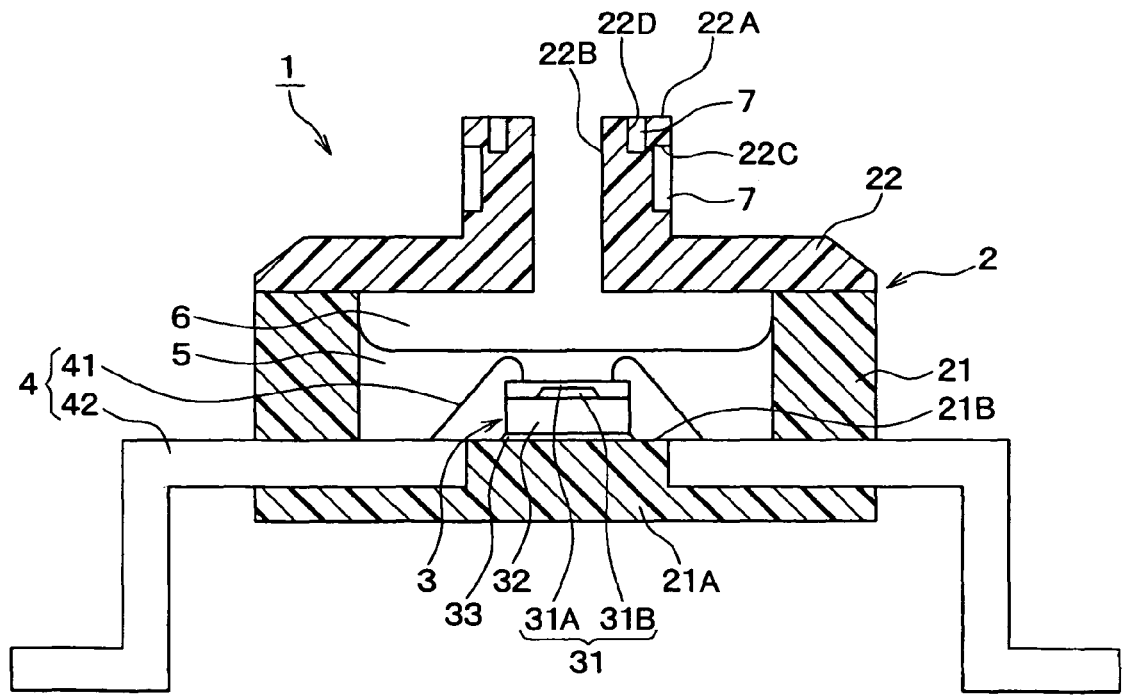
FIG. 4 is a cross sectional view illustrating a schematic configuration of a pressure sensor in accordance with a fourth embodiment.

FIG. 4 is a cross sectional view illustrating a schematic configuration of the pressure sensor 1 in accordance with the present embodiment. As shown in FIG. 4, the entering restriction element 7 is disposed in both a groove 22C formed on an exterior surface of the projection part 22A and a groove 22D formed on an apical surface of the projection part 22A. Since the entering restriction element 7 is disposed in multiple places for redundancy, it is possible to reliably restrict entry of an insect into the pressure introduction passage 22B.

Fifth Embodiment

A pressure sensor 1 according to a fifth embodiment is described below with reference to FIG. 5. The pressure sensor 1 according to the present embodiment is different from that according to the first embodiment in location where an entering restriction element 7 is disposed.

Figure 5A:
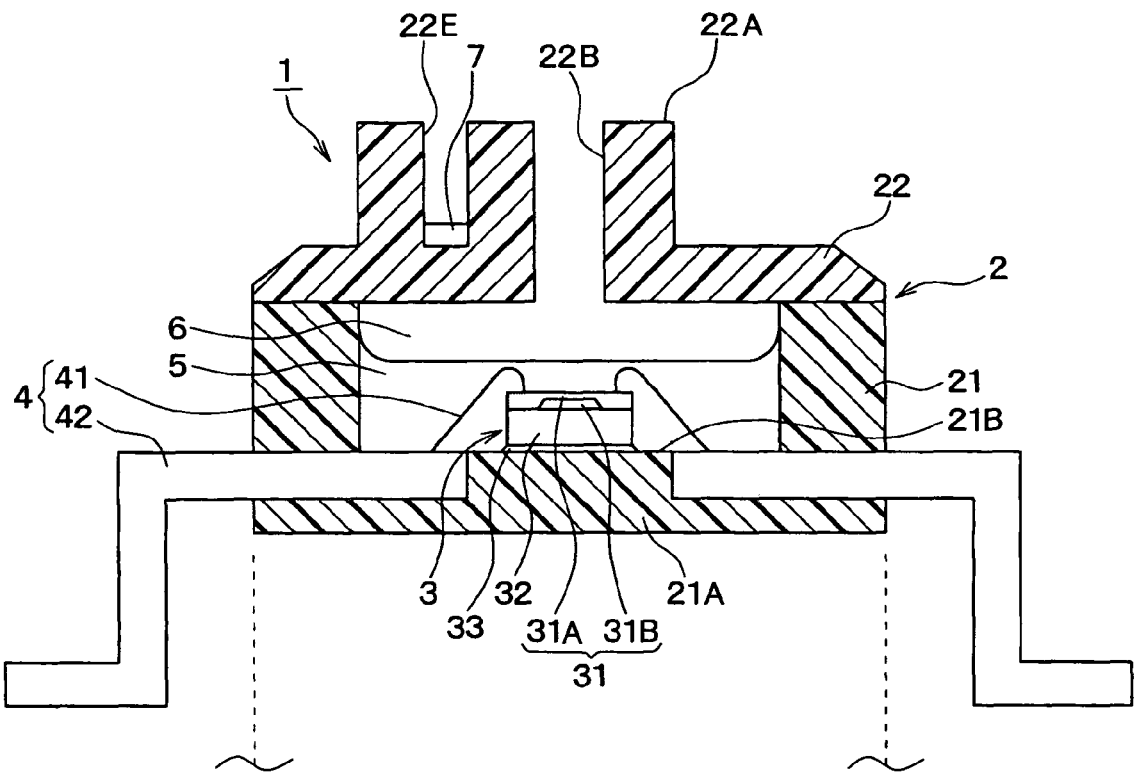
FIG. 5A is a cross sectional view illustrating a schematic configuration of a pressure sensor in accordance with a fifth embodiment, the view corresponding to that taken long line VA-VA in FIG. 5B.
Figure 5B:
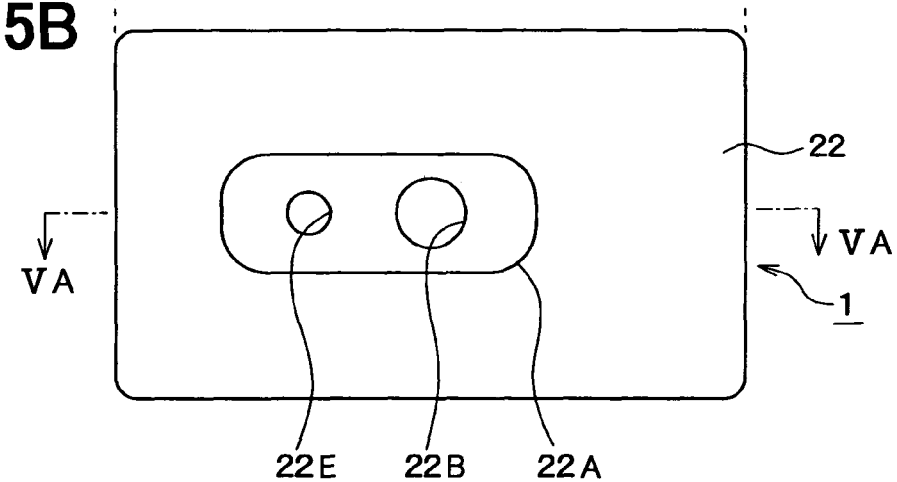
FIG. 5B is a top view illustrating a schematic configuration of the pressure sensor in accordance with the fifth embodiment.

FIG. 5A is a cross sectional view illustrating a schematic configuration of the pressure sensor 1 in accordance with the present embodiment, the cross sectional view being taken long line VA-VA in FIG. 5B. FIG. 5B is a top view illustrating the pressure sensor 1 in accordance with the present embodiment.

As shown in FIGS. 5A and 5B, according to the present embodiment, a projection part 22A substantially has such a cross sectional shape as a partially-overlapping two-circular shape or an elliptical shape. The projection part 22A further includes an additional hole 22E (i.e., a dummy hole 22E), which is located adjacent to the pressure introduction passage 22B. A radius (i.e., size) of the dummy hole E is smaller than that of the pressure introduction passage 22B. The dummy hole E does not extend to the space 6, but terminates in the upper case portion 22, while the pressure introduction passage 22B is directly in communication with the space 6. An entering restriction element 7 is disposed on a closed end of the dummy hole 22E.

When the dummy hole having smaller radius is formed so as to be adjacent to the pressure introduction passage 22B, an insect such as ant tends to enter the smaller hole 22E in habit. Therefore, it is possible to cause the insect such as ant not to enter the pressure introduction passage 22B but to enter the dummy hole 22E. It is accordingly possible to catch or kill the inset due to the entering restriction element 7 disposed in the dummy hole 22E. The pressure sensor 1 according to the present embodiment has advantages almost identical to that according to the first embodiment.

Other Embodiments

According to the above-described first to fourth embodiments, the entering restriction element 7 is disposed in a periphery of the pressure introduction passage 22B so as to surround the entire perimeter of the open end of the pressure introduction passage 22B. Alternatively, the entering restriction element 7 may be disposed so as to partially surround the perimeter of the open end of the pressure introduction passage 22B. That is, the entering restriction element 7 may be disposed in one part or multiple parts of the periphery of the pressure introduction passage 22B. When the entering restriction element 7 is disposed in the multiple parts, it may be preferable that the entering restriction element 7 is disposed at regular intervals around the pressure introduction passage 22B.

According to the fifth embodiment, the radius of the dummy hole 22E is formed to be smaller than that of the pressure introduction passage 22B. Alternatively, the dummy hole 22E may have a substantially circular ring shape and surrounds the pressure introduction passage 22B. Alternatively, multiple dummy holes 22E may be arranged in a circular pattern. According to the above embodiments, as shown in FIG. 5B, each open end of the pressure introduction passage 22B and the dummy hole 22E has a substantially circular shape. Alternatively, each open end may have another shape such as a polygonal shape. In the above alternative configuration, when a pressure sensor 1 is configured such that the size of the dummy hole 22E is smaller than that of the pressure introduction passage 22B, the pressure sensor 1 can have the above-described advantages.

While the invention has been described with reference to preferred embodiments thereof, it is to be understood that the invention is not limited to the preferred embodiments and construction. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A pressure sensor comprising:
   a sensing element including a sensor chip, wherein the sensor chip has a diaphragm;
   a case having a space, wherein the sensing element is disposed in the space, wherein the case has a pressure introduction passage having an open end on an exterior surface of the case, wherein the pressure introduction passage is in communication with the space to introduce a pressure medium into the sensing element;
   a line element having a first portion exposed to the space and a second portion exposed to an outside of the case, wherein the first portion is electrically connected with the sensing element, wherein the second portion is capable of providing an electrical connection between the sensing element and an external element, wherein the sensing element outputs a detection signal to the line element, wherein the detection signal depends on a pressure of the pressure medium applied to the diaphragm; and
   an insect entering restriction element extending across a path on the exterior surface of the case, the path interconnecting between the second portion of the line element and the open end of the pressure introduction passage, wherein:
   the case includes a first case portion and a second case portion;
   the first case portion forms the space having an open end and a closed end;
   the second case portion is fixed to the first case portion at a part of a surface of the first case portion, the part of the surface surrounding the open end of the space;
   the second case portion forms the pressure introduction passage;
   the second case portion includes a projection part projecting in a direction away from the first case portion; and
   the insect entering restriction element is disposed on the projection part.

2. The pressure sensor according to claim 1, wherein:
   the insect entering restriction element is disposed in a periphery of the pressure introduction passage so as to surround an entire perimeter of the open end of the pressure introduction passage.

3. The pressure sensor according to claim 2, wherein:
   the case has a groove on the exterior surface of the case;
   the groove is disposed in the periphery of the pressure introduction passage so as to surround the entire perimeter of the open end of the pressure introduction passage; and
   the insect entering restriction element is disposed in the groove.

4. The pressure sensor according to claim 3, wherein:
   the groove includes a plurality of groove portions; and
   the insect entering restriction element is disposed in each of the plurality of groove portions.

5. The pressure sensor according to claim 1, wherein:
   the projection part has a groove surrounding the entire perimeter of the open end of the pressure introduction passage; and
   the insect entering restriction element is disposed in the groove.

6. The pressure sensor according to claim 5, wherein:
   the projection part has an exterior surface; and
   the groove is disposed on the exterior surface of the projection part.

7. The pressure sensor according to claim 5, wherein:
   the groove is disposed on an apical surface of the projection part.

8. The pressure sensor according to claim 1,
   the insect entering restriction element is disposed on an apical surface of the projection part.

9. The pressure sensor according to claim 1, wherein:
   the projection part has a hole having an open end and a closed end;

the hole is spaced away from the pressure introduction passage;

a size of the hole is smaller than that of the pressure introduction passage; and the insect entering restriction element is disposed in the hole.

10. The pressure sensor according to claim 9, wherein the hole has a circular ring shape so as to surround the entire perimeter of the open end of the pressure introduction passage.

11. The pressure sensor according to claim 1, wherein the insect entering restriction element includes at least one member selected from the group consisting of an adhesive member for catching an insect, an insect killer having an insecticidal effect, and a bait poison having an insecticidal effect.

12. The pressure sensor according to claim 1, wherein:

the insect entering restriction element is arranged in a circular pattern with respect to the open end of the pressure introduction passage.

13. The pressure sensor according to claim 1, wherein the pressure introduction passage extends through the projection part.

* * * * *